(12) United States Patent
Zhang et al.

(10) Patent No.: US 6,987,283 B2
(45) Date of Patent: Jan. 17, 2006

(54) SEMICONDUCTOR DEVICE STRUCTURE

(75) Inventors: Hongyong Zhang, Kanagawa (JP);
Toru Takayama, Kanagawa (JP);
Yasuhiko Takemura, Kanagawa (JP);
Akiharu Miyanaga, Kanagawa (JP);
Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/180,015

(22) Filed: Jun. 27, 2002

(65) Prior Publication Data

US 2002/0163043 A1 Nov. 7, 2002

Related U.S. Application Data

(62) Division of application No. 08/670,122, filed on Jun. 25, 1996, now Pat. No. 6,413,805, which is a division of application No. 08/208,880, filed on Mar. 11, 1994, now abandoned.

(30) Foreign Application Priority Data

| Mar. 12, 1993 | (JP) | ................................... 5-79006 |
| Dec. 24, 1993 | (JP) | ................................. 5-347641 |
| Dec. 24, 1993 | (JP) | ................................. 5-347643 |

(51) Int. Cl.
*H01L 29/76* (2006.01)
(52) U.S. Cl. ............................ 257/59; 257/66; 257/72; 257/290
(58) Field of Classification Search ............ 257/66–72, 257/59, 290, 291; 438/149–152, 157, 166, 438/164, 487, 48, 128, 283
See application file for complete search history.

(56) References Cited

U.S. PATENT DOCUMENTS

| 3,783,049 A | 1/1974 | Sandera |
| RE28,385 E | 4/1975 | Mayer |

(Continued)

FOREIGN PATENT DOCUMENTS

| EP | 0 178 447 | 10/1984 |

(Continued)

OTHER PUBLICATIONS

Kawazu et al., "Low Temperature Crystallization of Hydrogenated Amorphous Silicon Induced by Nickel Silicide Formation", pp. 2698-2704, Dec. 1990, Institute of Applied Physics, vol. 29, No. 12.

(Continued)

*Primary Examiner*—Carl Whitehead, Jr.
*Assistant Examiner*—Yennhu B. Huynh
(74) *Attorney, Agent, or Firm*—Nixon Peabody LLP; Jeffrey L. Costellia

(57) ABSTRACT

In thin film transistors (TFTs) having an active layer of crystalline silicon adapted for mass production, a catalytic element is introduced into doped regions of an amorphous silicon film by ion implantation or other means. This film is crystallized at a temperature below the strain point of the glass substrate. Further, a gate insulating film and a gate electrode are formed. Impurities are introduced by a self-aligning process. Then, the laminate is annealed below the strain point of the substrate to activate the dopant impurities. On the other hand, Neckel or other element is also used as a catalytic element for promoting crystallization of an amorphous silicon film. First, this catalytic element is applied in contact with the surface of the amorphous silicon film. The film is heated at 450 to 650° C. to create crystal nuclei. The film is further heated at a higher temperature to grow the crystal grains. In this way, a crystalline silicon film having improved crystallinity is formed.

9 Claims, 8 Drawing Sheets

U.S. PATENT DOCUMENTS

| | | | |
|---|---|---|---|
| RE28,386 E | 4/1975 | Heiman et al. | |
| 4,059,461 A | 11/1977 | Fan et al. | |
| 4,068,020 A | 1/1978 | Reuschel | |
| 4,086,020 A | 4/1978 | Tanabe et al. | |
| 4,132,571 A | 1/1979 | Cuomo et al. | |
| 4,174,217 A | 11/1979 | Flatley | |
| 4,226,898 A | 10/1980 | Ovshinsky et al. | |
| 4,231,809 A | 11/1980 | Schmidt | |
| 4,271,422 A | 6/1981 | Ipri | |
| 4,277,884 A | 7/1981 | Hsu | |
| 4,300,989 A | 11/1981 | Chang | |
| 4,309,224 A | 1/1982 | Shibata | |
| 4,331,709 A | 5/1982 | Risch et al. | |
| 4,379,020 A | 4/1983 | Glaeser et al. | |
| 4,409,724 A * | 10/1983 | Tasch et al. | 29/571 |
| 4,472,210 A | 9/1984 | Wu et al. | |
| 4,509,990 A | 4/1985 | Vasudev | |
| 4,534,820 A | 8/1985 | Mori et al. | |
| 4,544,418 A | 10/1985 | Gibbons | |
| 4,597,160 A | 7/1986 | Ipri | |
| 4,634,473 A | 1/1987 | Swartz et al. | |
| 4,755,481 A | 7/1988 | Faraone | |
| 4,959,247 A | 9/1990 | Moser et al. | |
| 5,043,224 A | 8/1991 | Jaccodine et al. | |
| 5,075,259 A | 12/1991 | Moran | |
| 5,112,764 A | 5/1992 | Mitra et al. | |
| 5,145,808 A | 9/1992 | Sameshima et al. | |
| 5,147,826 A | 9/1992 | Liu et al. | |
| 5,173,446 A | 12/1992 | Asakawa et al. | |
| 5,194,934 A | 3/1993 | Yamazaki et al. | |
| 5,200,630 A | 4/1993 | Nakamura et al. | |
| 5,221,423 A | 6/1993 | Sugino et al. | |
| 5,225,355 A | 7/1993 | Sugino et al. | |
| 5,244,836 A | 9/1993 | Lim | |
| 5,248,630 A | 9/1993 | Serikawa et al. | |
| 5,252,502 A | 10/1993 | Havemann | |
| 5,254,480 A | 10/1993 | Tran | |
| 5,262,350 A | 11/1993 | Yamazaki et al. | |
| 5,262,654 A | 11/1993 | Yamazaki | |
| 5,275,851 A * | 1/1994 | Fonash et al. | 438/479 |
| 5,278,093 A | 1/1994 | Yonehara | |
| 5,289,030 A | 2/1994 | Yamazaki et al. | |
| 5,296,405 A | 3/1994 | Yamazaki et al. | |
| 5,298,075 A | 3/1994 | Lagendijk et al. | |
| 5,308,998 A | 5/1994 | Yamazaki et al. | |
| 5,313,075 A | 5/1994 | Zhang et al. | |
| 5,352,291 A | 10/1994 | Zhang et al. | |
| 5,358,907 A | 10/1994 | Wong | |
| 5,366,926 A | 11/1994 | Mei et al. | |
| 5,395,804 A * | 3/1995 | Ueda | 437/233 |
| 5,403,772 A * | 4/1995 | Zhang et al. | 437/101 |
| 5,424,230 A | 6/1995 | Wakai | |
| 5,426,064 A | 6/1995 | Zhang et al. | |
| 5,480,811 A | 1/1996 | Chiang et al. | |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,529,937 A | 6/1996 | Zhang et al. | |
| 5,531,182 A | 7/1996 | Yonehara | |
| 5,534,716 A | 7/1996 | Takemura | |
| 5,543,352 A | 8/1996 | Ohtani et al. | |
| 5,550,070 A | 8/1996 | Funai et al. | |
| 5,563,426 A | 10/1996 | Zhang et al. | |
| 5,569,610 A | 10/1996 | Zhang et al. | |
| 5,569,936 A | 10/1996 | Zhang et al. | |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |
| 5,646,424 A | 7/1997 | Zhang et al. | |
| 5,654,203 A | 8/1997 | Ohtani et al. | |
| 5,656,825 A | 8/1997 | Kusumoto et al. | |
| 5,663,077 A | 9/1997 | Adachi et al. | |
| 5,677,549 A | 10/1997 | Takayama et al. | |
| 5,696,003 A | 12/1997 | Makita et al. | |
| 5,696,386 A | 12/1997 | Yamazaki | |
| 5,696,388 A | 12/1997 | Funada et al. | |
| 5,700,333 A | 12/1997 | Yamazaki et al. | |
| 5,705,829 A | 1/1998 | Miyanaga et al. | |
| 5,712,191 A | 1/1998 | Nakajima et al. | |
| 5,756,364 A | 5/1998 | Tanaka et al. | |
| 5,821,559 A | 10/1998 | Yamazaki et al. | |
| 5,821,562 A | 10/1998 | Makita et al. | |
| 5,854,494 A | 12/1998 | Yamazaki et al. | |
| 5,923,962 A | 7/1999 | Ohtani et al. | |
| 6,028,333 A | 2/2000 | Yamazaki et al. | |
| 6,326,642 B1 | 12/2001 | Yamazaki et al. | |
| 2002/0000554 A1 | 1/2002 | Yamazaki et al. | |
| 2002/0117736 A1 * | 8/2002 | Yamazaki et al. | 257/627 |

FOREIGN PATENT DOCUMENTS

| | | |
|---|---|---|
| JP | 60-105216 | 6/1985 |
| JP | 61-058879 | 3/1986 |
| JP | 61-063107 | 4/1986 |
| JP | 63-056912 | 3/1988 |
| JP | 63-142807 | 6/1988 |
| JP | 64-027222 | 1/1989 |
| JP | 01-187814 | 7/1989 |
| JP | 01-187874 | 7/1989 |
| JP | 01-187875 | 7/1989 |
| JP | 01-206632 | 8/1989 |
| JP | 02-122631 | 5/1990 |
| JP | 02-140915 | 5/1990 |
| JP | 02-260521 | 10/1990 |
| JP | 02-260524 | 10/1990 |
| JP | 02-275641 | 11/1990 |
| JP | 03-022540 | 1/1991 |
| JP | 03-024717 | 2/1991 |
| JP | 03-135071 | 6/1991 |
| JP | 03-227525 | 10/1991 |
| JP | 03-280418 | 12/1991 |
| JP | 03-280420 | 12/1991 |
| JP | 03-280468 | 12/1991 |
| JP | 04-022120 | 1/1992 |
| JP | 04-078172 | 3/1992 |
| JP | 04-196312 | 7/1992 |
| JP | 04-286370 | 10/1992 |
| JP | 04-340724 | 11/1992 |
| JP | 05-013357 | 1/1993 |
| JP | 05-055166 | 3/1993 |
| JP | 05-063001 | 3/1993 |
| JP | 05-082442 | 4/1993 |
| JP | 05-218368 | 8/1993 |
| JP | 05-299348 | 11/1993 |

| | | |
|---|---|---|
| JP | 05-335572 | 12/1993 |
| JP | 07-161634 | 6/1995 |
| JP | 07-176479 | 7/1995 |

OTHER PUBLICATIONS

Dvurechenskii et al., "Transport Phenomena in Amorphous Silicon Doped by Ion Implantation of 3D Metals", pp. 635-640, 1986, Phys. Stat. Sol. 95.

Hayzelden et al., "In Situ Transmission Electron Microscopy Studies of Silicide Mediated Crystallization of Amorphous Silicon", pp. 225-227, 1992, Appl. Phys. Lett., 60 (2).

Hempel et al., "Needle-like Crystallization of Ni Doped Amorphous Silicon Thin Films", pp. 921-924, 1993, Solid State Communications, vol. 85, No. 11.

Kakkad et al., "Crystallized Si Films by Low-Temperature Rapid Thermal Annealing of Amorphous Silicon", pp. 2069-2072, Mar. 1, 1989, J. Appl. Phys., 65 (5).

Liu et al., "Polycrystalline Silicon Thin Film Transistors on Corning 7059 Glass Substrates Using Short Time, Low-Temperature Processing", pp. 2554-2556, May 17, 1993, Appl. Phys. Lett., 62 (20).

Liu et al., "Selective Area Crystallization of Amorphous Silicon Films by Low-Temperature Rapid Thermal Annealing", pp. 660-662, Aug. 14, 1989, Appl. Phys. Lett., 55 (7).

Kaddad et al., Low Temperature Selective Crystallization of Amorphous Silicon, pp. 66-68, 1989, Journal of Non-Crystalline Solids, 115.

Wolf et al., "Silicon Processing for the VLSI Era", pp. 56-58, 179, 1986, vol. 1.

Hatalis et al., "High Performance TFTs in Low Temperature Crytallized LPCVD Amorphous Silicon Films", Aug. 1987, Elec. Dev. Letters vol. EDL 8, No. 8.

Takenaka et al., "High Mobility Poly-Si Thin Film Transistors Using Solid Phase Crystallized a-Si Films Deposited by Plasma Enhanced Chemical Vapor Deposition", pp. L2380-2383, Dec. 12, 1990, J. Appl. Phys., 29 (12).

Green et al., "Method to Purify Semiconductor Wafers", pp. 1612-1613, Oct. 1973, IBM Technical Bulletin, vol. 16, No. 5.

Hayzelden et al., "Silicide Formation and Silicide Medicated Crystalliztion of Nickel-Implanted Amorphous Silicon Thin Films", pp. 8279-8289, Jun. 15, 1993, J. Appl. Phys., 73 (12).

Kuznetsov et al., "Silicide Percipitate Formation and Solid Phase Regrowth of Ni-Implanted Amorphous Silicon", pp. 191-194, Apr. 5-8, 1993, Inst. Phys. Conf. Ser. # 134.4; Proceedings of Royal Microscopical Society Conf.

Erokhin et al., "Spatially Confined NiSi Formation at 400° C On Ion Implantation Preamorphized Silicon", pp. 3173-3175, Dec. 6, 1993, Appl. Phys. Lett., 63 (23).

Stoemnos et al., "Crystallization of Amorphous Silicon by Reconstructive Transformation Utilizing Gold", pp. 1196-1198, Mar. 18, 1991, Appl. Phys. Lett., 58 (11).

Batstone et al., "Microscopic Processes in Crystallization", 1994, Solid State Phenomena, vols. 37-38.

Kuznetsov et al., "Enhanced Solid Phase Epitaxial Recrystalliztion of Amorphous Silicon Due to Nickel Silicide Precipitation Resulting From Ion Implantation and Annealing", pp. 990-993, 1993, Nucl. Instruments Methods Physics Research.

Wolf et al., "Silicon Processing for the VLSI Era", pp. 207-211, 1986, vol. 1.

Hatalis et al., "High Performance TFTs in Low Temperature Crystallized LPCVD Amorphous Silicon Films", Aug. 1987, Elec. Dev. Letters vol. EDL 8, No. 8.

Cammarata et al., "Silicide Percipitation and Silicon Crystallization in Nickel Implanted Amorphous Silicon Thin Films", pp. 2133-2138, Oct. 10, 1990, J. Mater. Res., vol. 5, No. 10.

Bruines et al., "Between Explosive Crystallization and Amorphous Strength Regrowth: Inhomogeneous Solidification Upon Pulsed Laser Annealing of Amorphous Silicon", p. 507, 1987, Appl. Phys. Lett., 50 (9).

Lau et al., "Solid Phase Epitaxy in Silicide Forming System", pp. 313-332, 1977, Thin Solid Films, 47.

Kawazu et al., "Low Temperature Crystalliztion of Hydrogentaed Amorphous Silicon Induced by Nickel Silicide Formation", pp. 2698-2704, Dec. 1990, Jap. J. Appl. Phys., vol. 29, No. 12.

Boyd et al., "Oxidation of Silicon Surfaces by CO Lasers", pp. 162-164, Jul. 1982, Appl. Phys. Lett., 41 (2).

Gandhi, S.K., VLSI Fabrication Principles, pp. 419-429, 1983, John Wiley & Sons.

Zorabedian et al., "Lateral Seeding of Silicon-on-Insu", pp. 81-86, 1984, Mat. Res. Soc. Symp. Proc., vol. 33.

Spaepen et al., "Metal-Enhanced Growth in Silicon", pp. 483-499, Nov. 1992, Crucial Issues in Semiconductor Materials & Processing Technologies.

Kawazu et al., "Initial Stage of the Interfacial Reaction Between Ni and a-Si:H", p. 7299, 1990, Jap. J. Appl. Phys., vol. 29, No. 4.

Surech et al., "Electroless Plated Ni Contacts to Hydrogenated Amorphous Silicon", p. 78, 1994, Thin Solid Films, 252.

Oki et al., "Effects of Deposited Metals on the Crystallization Temperature . . . ", p. 1506, 1969, Jap. J. Appl. Phys., 8.

Caune et al., "Combined CW Laser and Furnace Annealing of a-Si and Ge in Contact with Some Metals", p. 597, 1989, Appl. Surf. Sci., 36.

"Silicon Integrated Circuit Fabrication Technique", pp. 180-183, Dec. 10, 1985, published by Daiei-sha (with English translation).

Minjung's Essence English-Korean Dictionary, p. 965, 1993, Fifth Edition.

Inter Press Dictionary of Science and Engineering, p. 502, 1990, IPC Third Edition.

Furukawa, "SOI Structure Formation Technology" (in Japanese, with concise English statement), pp. 11-23, 1987, published by Sangyo Tosho (Industry Books).

Nishizawa, "VLSI Technology 3: Semiconductor Process", pp. 119-121, 1979, published by Kougyou Chousakai Publishing Co., Ltd.

Wolf et al., "Silicon Processing for the VLSI Era", pp. 264-266, 1986, Lattice Press.

Wolf et al., Silicon Processing for the VLSI Era, pp. 215-216, 1986.

Inventors: Miyanaga et al., "Semiconductor Device and Method for Manufacturing the Same" Filing Date: May 1, 2002, Specifications and Drawings for U.S. Appl. No. 10/135,773.

Inventors: Miyanaga et al., "Method for Manufacturing an active Matrix Display Device Having a Plurality of Active Matrix Elements and a Driving Circuit Integrated on a Single Substrate" Filing Date: Nov. 21, 1997, Specifications and Drawigs for U.S. Appl. No. 08/975,918.

* cited by examiner

SEMICONDUCTOR DEVICE STRUCTURE

BACKGROUND OF THE INVENTION

1. Field of the Invention

The present invention relates to a method for forming a semiconductor device using a crystalline semiconductor in a semiconductor device forming method. Further, the present invention relates to a method for forming thin film transistors (TFTs). TFTs according to the invention can be formed either on an insulating substrate as made of glass or on a semiconductor substrate as made of a single crystal of silicon. More particularly, the invention relates to TFTs formed, utilizing both a crystallization process using thermal and/or optical annealing and an activation process.

2. Description of Related Art

In recent years, an insulated gate semiconductor device comprising a thin film active layer (also called an active region) formed on an insulating substrate has been studied. Especially, researches on insulated gate thin film transistors (TFTs) have been earnestly conducted. These TFTs are formed on a transparent insulating substrate and used to control pixels of a display device such as a liquid crystal display having a matrix structure. Also, the TFTs are used in the driver circuit of the display device. Depending on the material and the state of the crystal of the used semiconductor, they are classified as amorphous silicon TFTs or crystalline silicon TFTs.

Generally, an amorphous semiconductors have small field mobilities and so they cannot be used in TFTs which are required to operate at high speeds. Since the field mobility of P-type amorphous silicon is quite small, it is impossible to form P-channel TFTs (PMOS TFTs). Therefore, a complementary MOS circuit (CMOS) which would be formed by combining an N-channel TFT (NMOS TFT) with such a P-channel TFT cannot be obtained.

On the other hand, crystalline semiconductors have higher field mobilities than those of amorphous semiconductors and thus can operate at higher speeds. With crystalline silicon, PMOS TFTs can be formed as well as NMOS TFTs and so CMOS circuits can be built. For example, in a known active matrix liquid crystal display, not only the active matrix portions but also the peripheral circuit such as drivers are composed of CMOS crystalline TFTs. This structure is known as a monolithic structure. For this reason, TFTs using crystalline silicon have been earnestly studied and developed recently.

One method of obtaining crystalline silicon is irradiation of an amorphous silicon with laser light or other equivalent intense light so as to crystallize the silicon. However, there is no prospect of mass production because of instability of the laser output and instability caused by the fact that the process is quite short.

The method which is currently considered to be capable of being put into practical use is to crystallize amorphous silicon by heat. In this method, crystalline silicon can be obtained with small variations among batches. However, this method is not free from problems.

Usually, in order to obtain crystalline silicon, it is necessary that annealing is carried out at about 600° C. for a long time or that annealing is carried out at a high temperature exceeding 1000° C. Where the latter method is adopted, the usable substrate material is limited to quartz, thus increasing the cost of the substrate greatly. Where the former method is adopted, the material of the substrate can be selected from various substances but shrinkage of the substrate caused during thermal annealing presents problems. In particular, a decrease in the forming yield due to misalignment of masks has been pointed out. Accordingly, there is a demand for a process at lower temperatures. Specifically, there is a demand for a process which is carried out below the strain points of (preferably at temperatures lower than the strain points of glasses by more than 50° C.) various non-alkali glasses used as materials of substrates. The present invention is intended to solve these difficulties. It is an object of the invention to provide a method of mass-producing TFTs without incurring the foregoing problems.

TFTs are formed using a thin film semiconductor formed on a substrate. These TFTs are used in various ICs. Especially, TFTs of this kind have concerned as switching devices located at pixels in an active matrix liquid crystal display and as driver devices formed in peripheral circuit portions.

It is easy to use an amorphous silicon film as thin film transistors used in TFTs. However, this method has the problem that the electrical characteristics are low. In order to improve the characteristics of TFTs, a crystalline thin film silicon may be used. Crystalline silicon films are variously known as polycrystalline silicon, polysilicon, and silicon crystallite. To obtain such a crystalline silicon film, an amorphous silicon film is first formed. Then, the film is crystallized by heating.

However, crystalline silicon thin films obtained by the conventional heating process have relatively small particle diameters, and these particles are not uniform in size. In consequence, their characteristics are not uniform. Furthermore, their mobilities which represents the performance of completed devices are much inferior to the mobilities of single crystal silicon. Therefore, there is a demand for a crystalline silicon thin film having improved characteristics.

Our research has revealed that crystallization can be performed at 450 to 650° C., e.g., about 550° C., in a short time on the order of 4 hours by depositing a trace amount of elements such as nickel, palladium, and lead on the surface of an amorphous silicon film and then heating the laminate. Also, the obtained crystal grains can be controlled by the temperature and time of the crystallization. This means that an active layer necessary for devices can be formed.

In order to introduce a trace amount of element as described above, or a catalytic element for promoting crystallization, plasma processing, evaporation, or ion implantation is employed. The plasma processing uses a parallel plate type or positive column type CVD apparatus. Electrodes containing a catalytic element are used. A plasma is generated in an ambient of nitrogen, hydrogen, or the like. In this way, the catalytic element is added to the amorphous silicon film.

However, if the above described element exists in abundance in a semiconductor, then the reliability and the electrical stability of an device using this semiconductor is deteriorated. This produces undesirable results.

In particular, an element for promoting crystallization such as nickel (referred to herein as a catalytic element) is necessary to crystallize amorphous silicon but it is desired that the amount of catalytic elements in the crystallized silicon should be reduced to a minimum. To fit this requirement, a catalytic element which tends to be inactive within crystalline silicon is selected. At the same time, the amount of a catalytic element necessary for crystallization is minimized. For this purpose, it is necessary to precisely control the amount of the introduced catalytic element.

Using nickel as a catalytic element, an amorphous silicon film is formed, nickel is introduced by plasma processing and a crystalline silicon film is formed by heating. The crystallization process is carefully examined and discovered the following items:
(1) Where nickel was introduced into the amorphous silicon film by plasma processing, nickel atoms are penetrated considerably deep into the amorphous silicon film before the heating processing.
(2) At first, nuclei of crystals are produced at the surface through which nickel atoms are introduced.
(3) Where a nickel film is formed on the amorphous silicon film by evaporation, crystallization occurs in the same way as in the case in which plasma processing is carried out.

From the above items, it is concluded that all the nickel atoms introduced by plasma processing does not function effectively. That is, if a large amount of nickel is introduced, some nickel atoms may not function sufficiently. Therefore, it is considered that the points or surfaces at which nickel atoms are in contact with silicon atoms function during low temperature crystallization. it is concluded that nickel atoms are required to be dispersed most finely, i.e., almost on an atomic scale. In other words, the requirement is that a minimum concentration of nickel is dispersed on an atomic scale near the surface of an amorphous silicon film within a concentration range which permits low temperature crystallization.

Evaporation can be used as a method of introducing an infinitesimal amount of nickel only into a surface region of an amorphous silicon film, i.e., introducing an infinitesimal amount of a catalytic element for promoting crystallization of an amorphous silicon film only into a surface region of the amorphous silicon film. However, it is not easy to control the evaporation process, and it is difficult to strictly control the amount of the introduced catalytic element.

It is necessary that the amount of the introduced catalytic element is reduced to a minimum. In this case, satisfactory crystallinity cannot be obtained.

SUMMARY OF THE INVENTION

It is an object of the present invention to provide a method for forming a semiconductor device using a crystalline semiconductor in a semiconductor device forming method.

Our researches have revealed that crystallization of a substantially amorphous silicon film is promoted by adding a trace amount of catalytic material. Also, the crystallization temperature is lowered, and the crystallization time can be shortened. Examples of the catalytic element include single nickel (Ni), iron (Fe), cobalt (Co) and platinum (Pt), and compounds thereof such as silicides. In particular, these catalytic elements are introduced into the amorphous silicon film by ion implantation or other method. Then, this film is thermally annealed at an appropriate temperature, typically below 580° C., to crystallize the amorphous silicon film.

Of course, as the anneal temperature is elevated, the crystallization time is shortened. Also, the concentrations of nickel, iron, cobalt, and platinum are increased, the crystallization temperature is lowered, and the crystallization time is shortened. Our researches have demonstrated that in order to promote crystallization, it is necessary that the concentration of at least one of them is $10^{17}$ cm$^{-3}$ or more, preferably in excess of $5 \times 10^{18}$ cm$^{-3}$.

Since all the above described catalytic materials are undesirable for silicon, it is desired to suppress their concentrations as low as possible. Our researches have revealed that the total concentration of these catalytic materials is not greater than $10^{20}$ cm$^{-3}$.

We took notice of the effects of the catalytic elements and have found that the foregoing problems can be solved by using these effects. In the present invention, the crystallization temperature is lowered by introducing these catalytic elements into amorphous silicon film. The catalytic elements introduced in the silicon film is lowered the temperatures at which the dopant impurities are activated, or recrystallized. We have found that where catalytic elements are uniformly distributed by ion implantation or ion doping before the crystallization, the crystallization progresses quite smoothly. Typically, the crystallization and activation can be sufficiently done below 550° C. Also, we have found that if the anneal time is set to less than 8 hours, typically less than 4 hours, then satisfactory results are obtained.

It has been difficult for the prior art thermal annealing to crystallize a silicon film thinner than 1000 Å. In the present invention, the silicon film can be crystallized with great ease, at a lower temperature, and in a shorter time. TFTs having an active region thinner than 1000 Å, especially thinner than 500 Å, have excellent characteristics. In addition, small steps give rise to gate insulating film and gate electrodes having fewer defective step portions. Hence, the forming yield is high. In the past, however, only one method of crystallizing such a thin silicon film is laser annealing because it is difficult to crystallize the film by other methods. The present invention permits crystallization of a thin silicon film by thermal annealing. Furthermore, the production yield can be enhanced for the reason described above. In these respects, the present invention offers an epoch-making technique.

Furthermore, it is an object of the present invention to provide a method of forming a crystalline thin film semiconductor by heating processing using a catalytic element while satisfying the following requirements:
(1) The amount of the introduced catalytic element is controlled and is decreased to a minimum.
(2) The method is made highly productive.
(3) Crystallinity superior to the crystallinity obtained by heating processing is obtained.

In order to satisfy the above described object, a crystalline silicon film is obtained by using the following means. In the present invention, either a single catalytic element for promoting crystallization of an amorphous silicon film or a compound containing the catalytic element is held in contact with the amorphous silicon film. Under this condition, the amorphous silicon film is heated at a relatively low temperature of 450 to 650° C., e.g., about 550° C., to crystallize the amorphous silicon film totally or partially. The silicon film is annealed at a higher temperature to promote further crystallization. For example, where the substrate is made of quartz, the anneal is conducted at about 1000° C. In this way, a crystalline silicon film of quite high crystallinity is obtained.

A useful method of introducing the catalytic element for promoting crystallization is a method of applying a solution containing the catalytic element to the surface of the amorphous silicon film.

The present invention is characterized in that the catalytic element is introduced while kept in contact with the surface of the amorphous silicon film. This is quite important where the amount of the catalytic element is controlled.

The catalytic element may be introduced either into the top surface or into the bottom surface of the amorphous silicon film. Where the catalytic element is introduced into the top surface of the amorphous silicon film, a solution containing the catalytic element is applied to the surface of the amorphous silicon film after the amorphous silicon film is formed. Where the catalytic element is introduced into the bottom surface of the amorphous silicon film, the solution containing the catalytic element is applied to the surface of a base layer and the catalytic element is held in contact with the surface of the base layer before the amorphous silicon film is formed.

In another feature of the invention, an active region of a semiconductor device having at least one of PN, PI, NI, and other junctions is formed, using a crystallized silicon film. Examples of the semiconductor device include TFTs, diodes, and photosensors.

The following advantages can be obtained by adopting the novel structure:
(a) The concentration of the catalytic element in the solution can be controlled accurately in advance. The crystallinity can be enhanced. Also, the amount of the catalytic element can be reduced.
(b) If the solution is in contact with the surface of the amorphous silicon film, the amount of the catalytic element introduced into the amorphous silicon film is determined by the concentration of the catalytic element in the solution.
(c) Since the catalytic element adsorbed onto the surface of the amorphous silicon film principally contributes to the crystallization, the catalytic element can be introduced with a minimum concentration.
(d) Since a high temperature process is not needed, a crystalline silicon film of good crystallinity can be obtained.

Where the method of applying to the surface of the amorphous silicon film the solution containing the element for promoting the crystallization is used, a water solution, an organic solvent solution, or the like can be used as the above described solution. "Containing" means that the catalytic element is contained as a compound, otherwise the catalytic element is contained by simply dispersion.

The solution containing the catalytic element can be selected from water, alcohols, acids, and ammonia which are polar solvents.

Where nickel is used as a catalyst and contained in a polar solvent, the nickel is introduced as a nickel compound. Typically, this nickel compound is selected from nickel bromide, nickel acetate, nickel oxalate, nickel carbonate, nickel chloride, nickel iodide, nickel nitrate, nickel sulfate, nickel formate, nickel acetylacetonate, 4-cyclohexyl nickel butanoate, nickel oxide, and nickel hydroxide.

The solvent containing the catalytic element is selected from benzene, toluene, xylene, carbon tetrachloride, chloroform, and ether which are nonpolar solvents.

In this case, the nickel is introduced as a nickel compound. Typically, this nickel compound is selected from nickel acetylacetonate and 2-ethylhexyl nickel.

It is useful to add a surface active agent to the solution containing the catalytic element. This is intended to enhance the adhesion to the added surface and to control the adsorption. This surface active agent may be previously applied to the surface.

Where single nickel is used as the catalytic element, it is necessary to dissolve it in an acid.

In the example described above, a solution in which nickel as a catalytic element is fully dissolved is used. It is not always necessary that nickel should be fully dissolved. In this case, a material such as emulsion which is obtained by uniformly dispersing powder either of single nickel or of a nickel compound in a dispersing medium may be used. Also, a solution adapted for formation of an oxide film may be employed. OCD (Ohka diffusion source) manufactured by Tokyo Ohka Industrial Ltd., can be used as this solution. If this OCD solution is used, a silicon oxide film can be easily formed by applying the OCD solution to the surface to be applied and baking the surface at about 200° C. Furthermore, adding of impurities can be used in the present invention.

These principles can be applied also where materials other than nickel are used as the catalytic element.

Where nickel is used as the catalytic element for promoting crystallization and a polar solvent such as water is used as the solution containing this nickel, if this solution is applied directly to an amorphous silicon film, the solution might be repelled. In this case, a thin oxide film having a thickness of less than 100 Å is first formed. A solution containing a catalytic element is applied to its surface. In this way, the solution can be applied uniformly. Where a material such as a surface active agent is added to the solution, the wettability can be effectively improved.

Where a nonpolar solvent such as 2-ethylhexyl nickel is used as the solution, it can be directly applied to the surface of the amorphous silicon film. In this case, it is advantageous to previously apply a material such as an intimate contact agent used for application of a resist. However, if the amount of the applied material is too large, then addition of the catalytic element to the amorphous silicon film will be hindered.

Although the amount of the catalytic element in the solution depends on the kind of the solution, the ratio of the weight of nickel to the weight of the solution is preferably about 200 to 1 ppm, more preferably 50 to 1 ppm (by weight calculation). This value is determined, in accordance with the concentration of the nickel in the crystallized film and the resistance to hydrofluoric acid.

The heating temperature used during the crystallization process is set to 450 to 650° C. in the present invention. This is important for the following reason. As described previously, in the present invention, crystallization is started only at the interface between the catalytic element and the amorphous thin silicon film to obtain a thin film of crystalline silicon which has high crystallinity and homogeneous particle diameters. If nuclei form or crystals grow from locations other than the interface, the characteristics are made nonuniform, producing undesirable results. Our experiments have demonstrated that if the temperature lies in the above described range of 450–650° C. and if this process is conducted in a short time, crystallization in portions which is not in contact with the catalytic element can be neglected, and that configuration according to the present invention can be obtained. Where the temperature is below the above described range, the crystals do not grow sufficiently even if the catalytic element is added. Conversely, where the temperature is above the range described above, the crystals grow irrespective of the presence of a catalytic element.

After the crystallizing processing, an anneal can be carried out at a higher temperature. This improves the characteristics at the interface (boundary) of crystal grains and enhances the crystallinity of the crystallized silicon film. Moreover, the amorphous portion can be completely eliminated from the silicon film by carefully controlling the conditions in this process. In this manner, the degradation of the amorphous silicon film can be effectively prevented from proceeding with the passage of time. If this process is not carried out, high barriers are created at the grain boundaries and other problems occur. Typically, high mobilities cannot be obtained. With respect to reliability, it is difficult to form a stable device because of the effects of a trace amount of the catalytic elements bonded to amorphous portion existing at the grain boundaries.

Considering the atmospheric control during the high temperature annealing, a conventional process for thermally annealing a semiconductor is performed under an inert gas such as nitrogen. However, in the case of annealing a crystalline silicon film obtained by addition of a catalyst element and low temperature crystallization, it has been found extremely effective to conduct the high temperature annealing under an oxidizing gas atmosphere such as of oxygen, thereby to obtain the crystalline silicon film having stable characteristics. the reason for the above finding is yet to be clarified; presumably, the bonds between the catalyst element and silicon which are present in large quantity in the amorphous silicon portion become newly form bonds with oxygen to form a stable structure.

A silicon oxide film produced by thermal oxidation can also be formed by the aforementioned high temperature annealing of the crystalline silicon film in an oxidizing atmosphere, thereby improving its crystallinity. The silicon oxide film is very dense. The silicon oxide film having a thickness of several hundreds of angstroms or more is found to be sufficiently reliable to use as a gate insulating film. However, a high strain generates at the boundary between the crystalline silicon and the thermally oxidized film. it is therefore preferred to form the thermally oxidized film such thin as possible. Accordingly, to eliminate the degradation of the characteristics due to the presence of the strain, the thermally oxidized film once formed during the high temperature annealing in an oxidizing atmosphere performed for increasing the crystallinity of the silicon film may be etched to form a newly gate insulating film.

Further, the structure can be modified. That is, the amount of the catalytic element is reduced drastically, and crystallization caused by the first heating is ended immediately after generation of nuclei. Then, the crystals are grown by a high temperature anneal. In this case, the process for generating nuclei is effected independent of the process for growing the crystals. These processes are carried out at their respective appropriate temperatures.

The high temperature anneal for improving the crystallinity can be an ordinary anneal conducted within an electric furnace. Also, a method for irradiating intense light, especially infrared light, can be adopted. Infrared light is not readily absorbed by glass but easily absorbed by a thin silicon film. Therefore, a thin silicon film formed on a glass substrate can be selectively heated. This method using infrared radiation is called rapid thermal anneal (RTA) or rapid thermal process (RTP).

Also, crystals can be selectively grown by selectively applying a solution containing a catalytic element. In this case, it is possible that the crystals grow from the applied regions toward the non-applied regions substantially parallel to the surface of the silicon film. The regions in which the crystals grow substantially parallel to the surface of the silicon film are referred to herein as the lateral crystal growth regions.

It is confirmed that the concentration of the catalytic element is low in these regions where the crystals are grown laterally. Although it is advantageous to use a crystalline silicon film as the active region of a semiconductor device, the concentration of impurities in the active region should generally be lower. Accordingly, formation of the active region of a semiconductor device using the lateral crystal growth regions is useful for fabrication of a device.

In the present invention, the best effects can be produced when nickel is used as a catalytic element. Other desirable catalytic elements are Ni, Pt, Cu, Ag, Au, In, Sn, Pd, P, As, and Sb. Also, the catalytic element can be one or more elements selected from the groups VIII, IIIb, IVb, and Vb elements of the periodic table.

The method of introducing a catalytic element is not limited to use of a solution such as water solution or an alcohol. Various substances containing a catalytic element can be used. For example, a metal compound or oxide containing a catalytic element can be used.

DETAILED DESCRIPTION OF THE PREFERRED EMBODIMENT

[Embodiment 1]

Figure 1A:
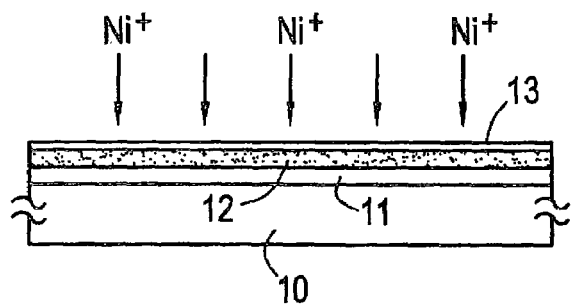
FIGS. 1A to 1D are diagrams explaining forming processes of Embodiment 1 of the invention.

FIGS. 1A to 1D show cross sections of TFTs (Thin Film Transistors) illustrating the forming processes of the first embodiment. First, a base film 11 of silicon oxide having a thickness of 2000 Å is formed on a substrate 10 (Corning 7059) by sputtering. Then, an amorphous silicon film 12 of the intrinsic (I type) having a thickness of 500 to 1500 Å, e.g., 1500 Å, is formed on the base film 11 by plasma CVD (Chemical Vapor Deposition). Further, a silicon oxide film 13 having a thickness of 200 Å is formed on the amorphous silicon film 12 by sputtering. Subsequently, nickel ions are introduced into the amorphous silicon film 12 by ion implantation. The dose is $2\times10^{13}$ to $2\times10^{14}$ cm$^{-2}$, e.g., $5\times10^{13}$ cm$^{-2}$. As a result, the concentration of the nickel in the amorphous silicon film 12 is about $5\times10^{18}$ cm$^{-3}$ (FIG. 1A).

The amorphous silicon film 12 is annealed at 550° C. for 4 hours in a nitrogen ambience to crystallize it. Thereafter, the amorphous silicon film 12 is patterned to form silicon island region 14. Then, silicon oxide is deposited as a 1000 Å-thick gate insulating film 15 by sputtering. During this sputtering, silicon oxide is used as a target. The substrate temperature is 200 to 400° C., e.g., 250° C. The sputtering ambience includes oxygen and argon. The ratio of the argon to the oxygen (argon/oxygen) is 0 to 0.5, e.g., less than 0.1.

Figure 1B:
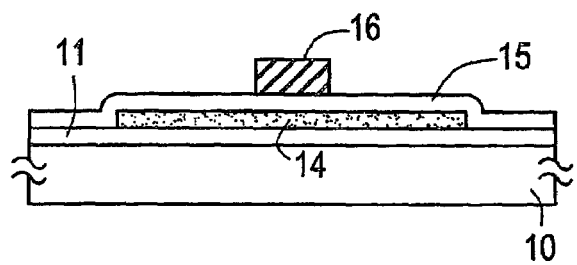

Subsequently, a silicon film having a thickness of 3000 to 8000 Å, e.g., 6000 Å, and containing 0.1 to 2% phosphorus is formed by LPCVD (Low Pressure Chemical Vapor Deposition). Preferably, the process for forming the silicon oxide and the process for forming the silicon film are carried out in succession. The silicon film is patterned to form gate electrode 16 (FIG. 1B).

Figure 1C:
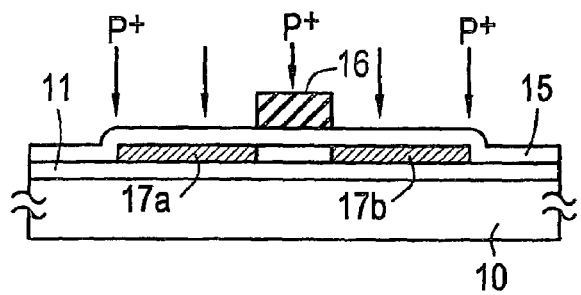

Then, impurities, or phosphorus, are introduced into the silicon regions by using the gate electrode 16 as a mask in plasma doping. Phosphine ($PH_3$) is used as a dopant gas. The accelerating voltage is 60 to 90 kV, e.g., 80 kV. The dose is $1\times10^{15}$ to $8\times10^{15}$ cm$^{-2}$, e.g., $2\times10^{15}$ cm$^{-2}$. In this way, N-type impurity regions 17a and 17b are formed (FIG. 1C).

Then, the laminate is annealed at 500° C. for 4 hours in a nitrogen ambience to activate the impurities. Preferably, the activation temperature is lower than the temperature of the previous crystallization process to reduce shrinkage of the substrate to a minimum. Since nickel atoms are distributed in the silicon film, recrystallization progresses easily although the process is a low temperature anneal. In this way, the impurity regions 17a and 17b are activated.

Figure 1D:
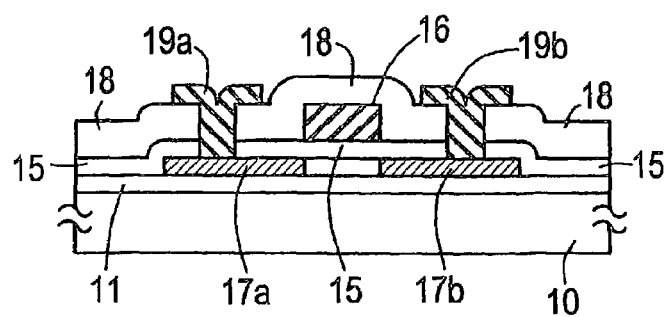

Subsequently, a silicon oxide film 18 having a thickness of 6000 Å is formed as an interlayer insulator by plasma CVD. Then, contact holes are formed in this insulator. Electrodes/wirings 19a and 19b for the source and drain regions of TFTs are formed from a multilayer film of metal materials, e.g., titanium nitride and aluminum. Finally, the laminate is annealed at 350° C. for 30 minutes at 1 atmospheric pressure in a hydrogen ambience. In this way, TFTs are completed (FIG. 1D).

The concentrations of nickel in the active region and the impurity regions of the TFTs are obtained by secondary ion mass spectroscopy (SIMS) and $1\times10^{18}$ to $5\times10^{18}$ cm$^{-3}$.

[Embodiment 2]

Figure 2A:
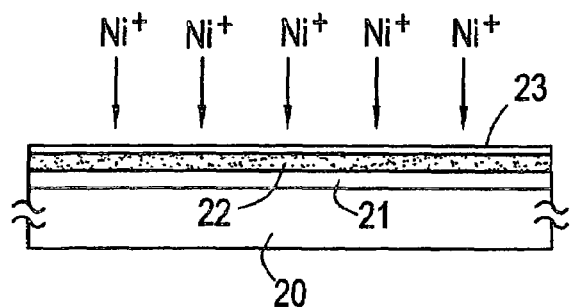
FIGS. 2A to 2D are diagrams explaining forming processes of Embodiment 2 of the invention.

FIGS. 2A to 2D shows cross sections illustrating the forming processes of the second embodiment. First, a base film 21 of silicon oxide having a thickness of 2000 Å is formed on a substrate 20 (Corning 7059) by sputtering. An amorphous silicon film 22 of the intrinsic (I type) having a thickness of 500 to 1500 Å, e.g., 500 Å, is formed by plasma CVD. A silicon oxide film 23 having a thickness of 200 Å is deposited by sputtering. Nickel ions are introduced into the silicon film by ion implantation. The dose is $2\times10^{13}$ to $2\times10^{14}$ cm$^{-2}$, e.g., $1\times10^{14}$ cm$^{-2}$. As a result, the concentration of nickel in the amorphous silicon film 12 is approximately $1\times10^{19}$ cm$^{-3}$ (FIG. 2A).

As the gate insulating film of crystalline silicon TFTs, a silicon oxide film 25 having a thickness of 1000 Å is formed from tetraethoxy silane (TEOS; $Si(OC_2H_5)_4$) and oxygen as a raw material gases by plasma CVD. Trichloroethylene ($C_2HCl_3$) is used in addition to the raw material gases. Before the formation of the film, oxygen is supplied into the chamber at 400 SCCM. A plasma is produced at a substrate temperature of 300° C., at a total pressure of 5 Pa, and at an RF power of 150 W. This condition is maintained for 10 minutes. Subsequently, oxygen, TEOS, and trichloroethylene are introduced into the chamber at 300 SCCM, 15 SCCM, and 2 SCCM, respectively. In this way, a silicon oxide film is formed. The temperature of the substrate is 300° C. The RF power is 75 W. The total pressure is 5 Pa. After completion of the film, hydrogen is introduced into the chamber at 100 torr. The laminate is annealed at 350° C. for 35 minutes.

Figure 2B:
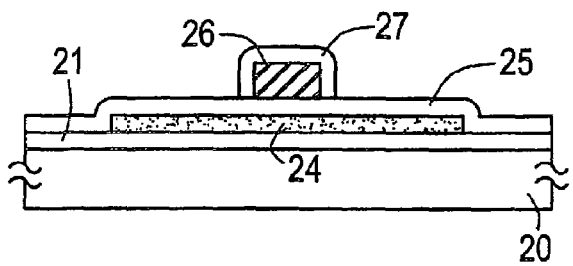

Subsequently, a tantalum film having a thickness of 3000 to 8000 Å, e.g., 6000 Å, is deposited by sputtering. Titanium, tungsten, molybdenum, or silicon may be used instead of tantalum. However, the used material must have sufficient heatproofness to make later activation. It is preferred that the process for forming the silicon oxide 25 and the process for forming the tantalum film are carried out in succession. Then, the tantalum film is patterned to form gate electrodes 26 of TFTs. The surfaces of the tantalum film used wiring are anodized to form oxide layers 27 on the surfaces. The anodization is conducted within 1 to 5% ethylene glycol solution of tartaric acid. The thickness of the obtained oxide layers is 2000 Å (FIG. 2B).

Figure 2C:
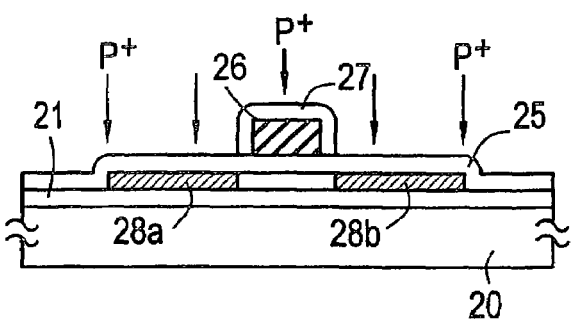

Impurity, or phosphorus, is introduced into the amorphous silicon regions by plasma doping. Phosphine ($PH_3$) is used as a dopant gas. The accelerating voltage is 80 kV. The dose is $2\times10^{15}$ cm$^{-2}$. As a result, N-type doped regions 28a and 28b are formed. Under this condition, the gate electrodes 26 has an offset relation to the doped regions 28 because of the anodic oxide (FIG. 2C).

The laminate is annealed at 500° C. for 4 hours in a nitrogen ambience to crystallize the amorphous silicon film and to activate the impurity. Since the N-type doped regions 28a, 28b and the active region, i.e., the semiconductor region under the gate, are doped with nickel ions, the annealing promotes both crystallization and activation.

Figure 2D:
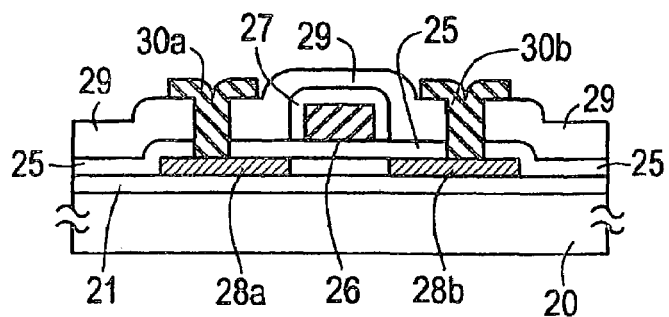

A silicon oxide film 29 having a thickness of 2000 Å is formed as an interlayer insulator from TEOS by plasma CVD. Then, contact holes are formed in the interlayer insulator. Source and drain electrodes/wirings 30a and 30b are fabricated from a multilayer film of metal materials, e.g., titanium nitride and aluminum. A semiconductor circuit is completed by the above processes (FIG. 2D).

The field effect mobility of the fabricated TFTs is 70 to 100 cm$^2$/Vs at a gate voltage of 10 V. The threshold value is 2.5 to 4.0 V. The leakage current when a voltage of −20 V is applied to the gate is less than $10^{-13}$ A.

The present invention can provide improved throughput by crystallizing an amorphous silicon film and activating dopant impurities in silicon at a low temperature of 500 to 550° C. and in a short time of 4 hours. Conventionally, where a process conducted at temperature equal to and larger than 600° C. is adopted, the manufacturing yield has reduced by shrinkage of the substrate This problem is fully solved by the invention.

This means that a substrate of a large area can be treated in one operation. In particular, when a substrate having a large area is treated, and numerous semiconductor circuits such as matrix circuits are sliced from the substrate, the cost of each circuit is greatly reduced. Where this is applied to liquid crystal displays, the efficiency of mass production and the characteristics are improved. In this way, the invention is industrially advantageous.

[Embodiment 3]

In Embodiment 3, a catalytic element for promoting crystallization is contained in an aqueous solution and applied to an amorphous silicon film. Then, the amorphous film is crystallized by heating. The crystallinity of the film is further enhanced by an anneal conducted at a higher temperature.

The process is described by referring to FIGS. 3A to 3D up to the point where a catalytic element, in the embodiment, nickel, is introduced. A substrate 41 made of quartz glass is used. This substrate has 100 mm×100 mm in size.

Figure 3A:
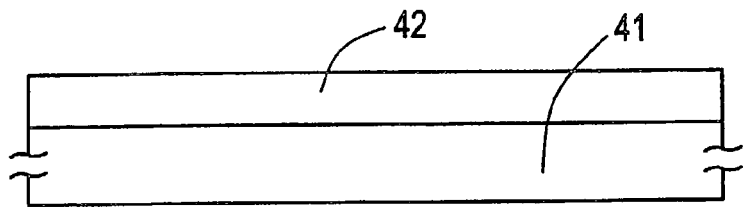
FIGS. 3A to 3D are diagrams explaining forming processes of Embodiment 3 of the invention.
Figure 3B:
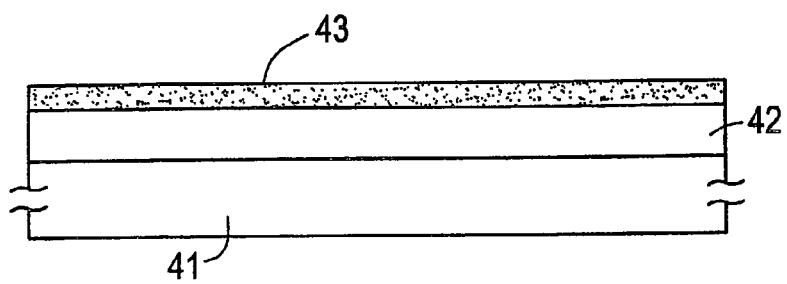

First, an amorphous silicon film having a thickness of 100 to 1500 Å is formed by plasma CVD or LPCVD. In this embodiment, the amorphous silicon film 42 having a thickness of 1000 Å is formed by plasma CVD (FIG. 3A).

To remove contaminants and the natural oxide film, the laminate is treated with hydrofluoric acid. Then, an oxide film 43 having a thickness of 10 to 50 Å is formed. If contamination can be neglected, the natural oxide film can be directly used instead of the oxide film 43.

Since the oxide film 43 is extremely thin, its exact thickness is unknown but it is considered to be about 20 Å. In this embodiment, the laminate is irradiated with UV (UltraViolet) light for 5 minutes in an oxygen ambience to form the oxide film 43. To form this oxide film 43, thermal oxidation can be utilized. Treatment using hydrogen peroxide may also be performed.

The oxide film 43 is intended to disperse an acetate solution over the whole surface of the amorphous silicon film 42 in a later process where the acetate solution containing nickel is applied. That is, the oxide film 43 improves the wettability. For example, if an acetate solution is directly applied to the surface of the amorphous silicon film 43, it is impossible to introduce the nickel into the whole surface of the amorphous silicon film 42 because the amorphous silicon film 43 repels the acetate solution. That is, a uniform crystallization cannot be effected.

Figure 3C:
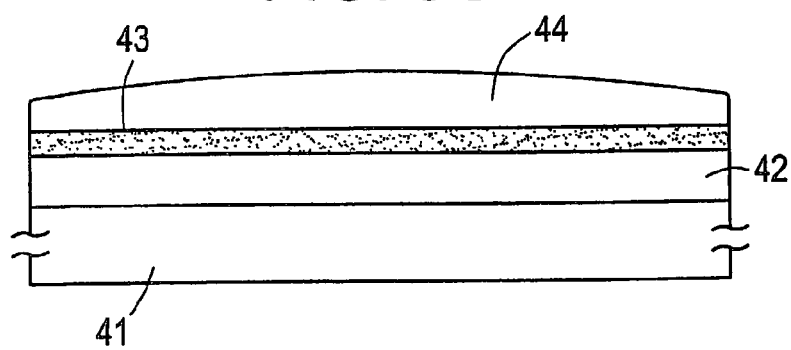
Figure 3D:
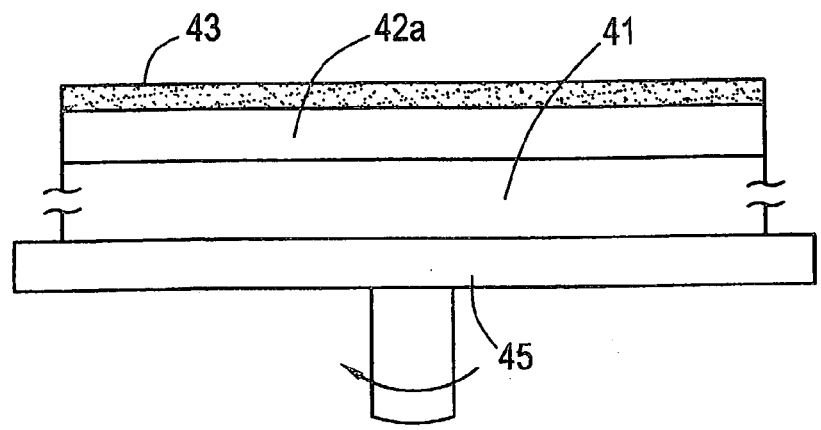

Then, nickel is added to an acetate solution. The concentration of the nickel is 25 ppm. Then, 2 ml of this acetate solution 44 is dripped onto the surface of the oxide film 43 which overlay the amorphous silicon film 42. This state is maintained for 5 minutes. Thereafter, a spin dry process is conducted with a spinner 45 at 2000 rpm for 60 seconds (FIGS. 3C and 3D).

The practical concentration of the nickel in the acetate solution is 1 ppm, preferably more than 10 ppm. Where a nonpolar solvent such as toluene solution of 2-ethylhexyl nickel is used as the solution described above, the oxide film 43 is dispensed with; the catalytic element can be directly introduced into the amorphous silicon film 43.

This process of applying the nickel solution is carried out once or repeated several times to form a layer containing nickel and having an average thickness between several Angstroms and hundreds of Angstroms on the surface of the amorphous silicon film 42 after the spin dry. In this case, the nickel in this layer diffuses into the amorphous silicon film 42 and acts as a catalyst for promoting crystallization in the later heating process. This layer is not always a perfect film.

After the application of the solution, the state is maintained for 1 minute. The concentration of the nickel eventually contained in the amorphous silicon film 42 can be controlled by adjusting this maintaining time but the most influential factor is the concentration in the solution.

In a heating furnace, the laminate is heated at 550° C. for 4 hours in a nitrogen ambience. As a result, a thin crystalline silicon film 42a formed on the substrate 41 could be obtained.

The heating described above can be effected above 450° C. However, if the temperature is lower, the heating time must be prolonged. This reduces the efficiency of production. If the temperature is too high, crystals begin to grow from locations other than the portions in contact with nickel. As a result, a crystalline silicon film having large silicon grains cannot be formed.

In the present embodiment, a catalytic element is applied to the top surface of an amorphous silicon film. The catalytic element may be applied to the bottom surface of the amorphous silicon film. In this case, using a solution containing a catalytic element, this element may be applied to the base film before formation of the amorphous silicon film.

After obtaining the crystalline silicon film 42a by heating, the laminate is treated with hydrofluoric acid to remove contaminants and natural oxide film. Then, the laminate is annealed at 1000° C. for a time between 30 minutes and 2 hours (in the present embodiment 100 minutes) in a nitrogen ambience to enhance the crystallinity inside the crystal grains and to improve the characteristics at the interface. It is expected that this process would reduce defects inside the crystals. This process can be carried out in an oxygen ambience to improve the crystallinity. In addition, a thermal oxide film about 1000 Å thick may be formed.

Thereafter, the oxide film is removed, and the laminate is observed with TEM (Transmission Electron Microscopy). We have found that the obtained crystalline silicon film has crystal grains of large diameters with anisotropy and that longer ones of the longer sides of the grains are in excess of 10 μm. In addition, their sizes are comparatively uniform.

[Embodiment 4]

The present embodiment is similar to Embodiment 3 except that a silicon oxide film having a thickness of 1200 Å is selectively formed and that nickel is selectively introduced, using the silicon oxide film as a mask.

Figure 4A:
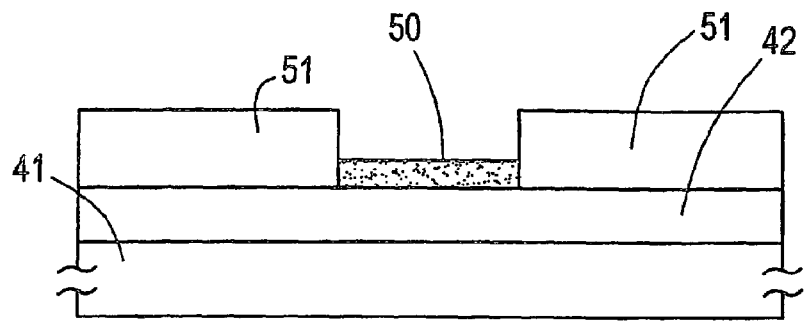
FIGS. 4A to 4C are diagrams explaining forming processes of Embodiment 4 of the invention.
Figure 4B:
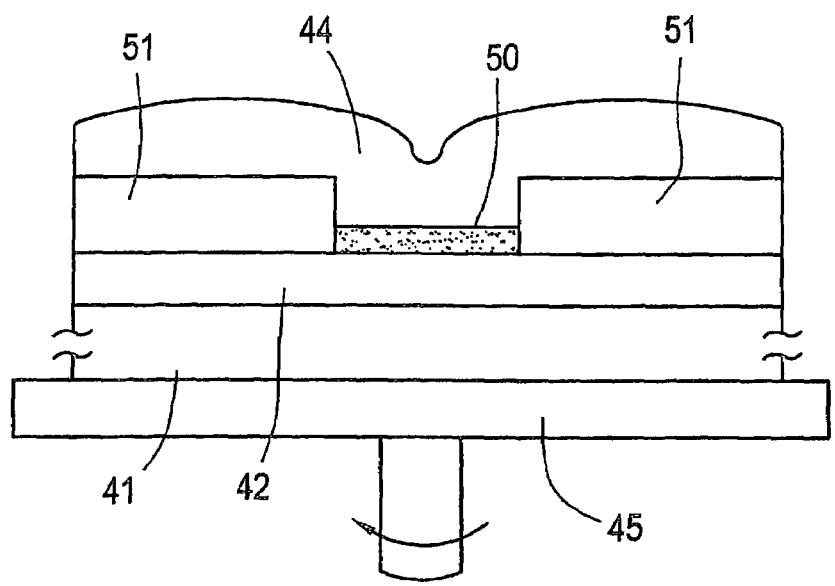
Figure 4C:
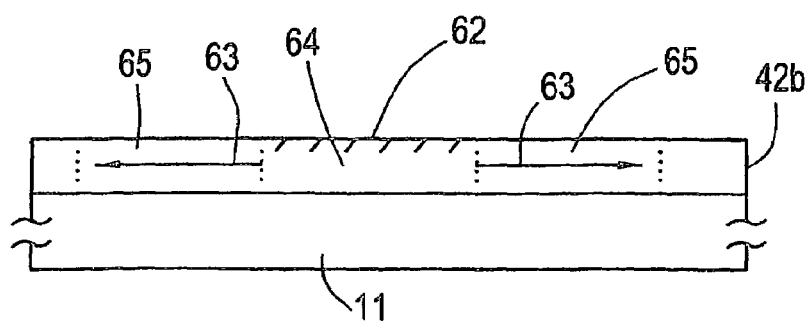

FIGS. 4A to 4C schematically show manufacturing processes of the present embodiment. First, an amorphous silicon film 42 having a thickness of 1000 Å is formed on a substrate 41 made of quartz glass by plasma CVD or LPCVD (low pressure thermal CVD). The substrate 41 is 10 cm square.

Then, a silicon oxide film 51 used as a mask is formed to a thickness greater than 1000 Å, in the present embodiment 1200 Å. Our experiment has shown that where the thickness of the silicon oxide film 51 is set to 500 Å, no problems took place. If the film is dense, the thickness can be reduced further.

The silicon oxide film 51 is patterned by an ordinary photolithography process to form a desired pattern. The film is irradiated with UV light for 5 minutes in an oxygen ambience to form a thin silicon oxide film 51. We consider that the thickness of this silicon oxide film 51 is about 20 to 50 Å (FIG. 4A). With respect to the silicon oxide film for improving the wettability, if the solution matches a size of the pattern, then addition may be well conducted only by the hydrophilic property of the mask of the silicon oxide film. However, this is a special case. Generally, it is safer to use the silicon oxide film 51.

Under this condition, 5 ml of acetate solution 44 containing 100 ppm of nickel is dripped, in the same way as in Embodiment 3, where the substrate is 10 cm square. The laminate is spun at 50 rpm for 10 seconds with the spinner 45 to uniformly spin coat a water film over the whole surface of the laminate. The state is maintained for 5 minutes. Then, a spin dry process is effected with the spinner 45 at 2000 rpm for 60 seconds (FIG. 4B). Instead, the laminate can be rotated at 0 to 150 rpm on the spinner 45 during above maintaining.

The laminate is heated at 550° C. for 4 hours in a nitrogen ambience to crystallize the amorphous silicon film 42. At this time, crystals grew laterally from portion 62 introduced with nickel toward region 65 not introduced with nickel, as indicated by arrow 63. In FIG. 4C, nickel is directly introduced into a region 24 so that crystals are grown. In the region 25, the crystals grow laterally. We have confirmed that the crystals grow roughly in <111> axial direction in the region 25.

At this stage, the laminate is observed with TEM. We have observed that in the obtained crystalline silicon film, pillar-like radial crystals of uniform width grow radially from the region introduced with nickel toward the surroundings, and amorphous portions remains n the gaps between the individual crystals.

Then, after the crystallization process using the heating described above, the silicon oxide film is peeled off. The remaining laminate is annealed at 1000° C. in a nitrogen ambience to improve the crystallinity of the silicon film 42a further. The crystallinity of the lateral crystal growth region 25 could be enhanced greatly by this process. This crystalline silicon film is observed with TEM. We have found that the gaps between the pillar-like crystals are crystallized and that pseudo epitaxial growth occurred around the pillar-like crystals as nucleus. As a result, a crystalline silicon film which had almost discernible grain boundaries and looked as if it consisted of a gigantic crystal grain exceeding several tens of micrometers is obtained.

In the present embodiment, the concentration of nickel in the region in which nickel has been directly introduced can be controlled in a range from $1 \times 10^{15}$ to $1 \times 10^{19}$ atoms/cm$^3$ by controlling the concentration of the solution and the retention time. Similarly, the concentration in the lateral growth region can be controlled to less value than the above concentration. In this film, the concentration of nickel is distributed like the letter "U" in the direction of the film thickness. The above described concentration indicates the bottom, or the minimum value, of the U-shaped distribution.

The crystalline silicon film formed by the present embodiment is characterized in that it is highly resistant to hydrofluoric acid. We understand that a crystalline silicon film fabricated by introducing nickel by plasma CVD and crystallizing the film has poor resistance to hydrofluoric acid.

For example, the following operations are sometimes necessary. A silicon oxide film acting as a gate insulating film and as an interlayer insulator film is formed on the above described crystalline silicon film. Then, holes for formation of electrodes are formed in the silicon oxide film. Thereafter, the electrodes are formed. In this case, it is customary to remove the silicon oxide film with buffered hydrofluoric acid. However, if the resistance of the crystalline silicon film to hydrofluoric acid is low, it is difficult to remove only the silicon oxide film; rather the crystalline silicon film is also etched away.

However, if the crystalline silicon film is resistant to hydrofluoric acid, the selectivity, i.e., the difference in etch rate between the silicon oxide film and the crystalline silicon film, can be made large and so only the silicon oxide film can be selectively etched away. This is quite useful for the manufacturing process.

As described above, in the lateral crystal growth region, the concentration of the catalytic element is small. In addition, the crystallinity is good. Therefore, it is advantageous to use this region as the active region of a semiconductor device. For instance, it is quite advantageous to use the region as the channel forming region of a thin film transistor.

[Embodiment 5]

In the present embodiment, TFTs are fabricated, using a crystalline silicon film formed by utilizing the present invention. The TFTs of the present embodiment can be used in the driver circuit and pixel portions of an active matrix type liquid crystal display. The application of the TFTs is not limited to liquid crystal displays. Obviously, the TFTs can also be used in so called thin film integrated circuits.

FIGS. 5A to 5E schematically shows manufacturing processes of the present embodiment. First, a silicon nitride film (not shown) is formed as a base layer on an NO glass substrate 120. Then, a silicon oxide film (not shown) having a thickness of 2000 Å. is formed on the silicon nitride film. These silicon nitride film and silicon oxide film are provided to prevent impurities from being diffused out of the glass substrate 120.

An amorphous silicon film 104 is formed to a thickness of 500 Å by the same method as used in Embodiment 3. Devices having satisfactory characteristics could be obtained by the use of an amorphous silicon film, which is formed by LPCVD, using silane or polysilane such as disilane. The laminate is treated with hydrofluoric acid to remove the natural oxide film. Then, a thin oxide film having a thickness of about 20 Å is formed by UV irradiation in an oxygen ambience. The method of forming this thin oxide film may make use of treatment using hydrogen peroxide or thermal oxidation.

An acetate solution containing 10 ppm of nickel is applied, and the state is maintained for 5 minutes. Spin dry is conducted using a spinner. Thereafter, the silicon oxide film is removed with buffered hydrofluoric acid. The laminate is heated at 550° C. for 4 hours to crystallize the silicon film. These processes are the same method as used in Embodiment 1.

By the heating process described above, a silicon film in which amorphous components are mixed with crystalline components is obtained. In the regions of the crystalline components, crystal nuclei exist. In a later high temperature crystal growth process, crystals would grow from these nuclei.

Then, the laminate is annealed at 800° C. for 2 hours in a nitrogen ambience to crystallize the whole surface and to promote crystallization of the silicon film. In this process, crystals grew from the crystal nuclei existing in the crystal components.

Figure 5A:
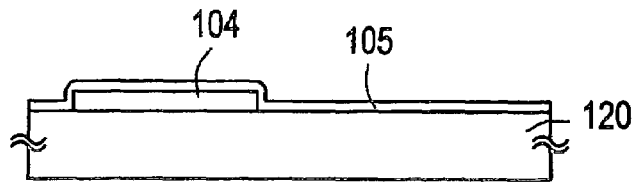
FIGS. 5A to 5E are diagrams explaining forming processes of Embodiment 5 of the invention.

Thereafter, the crystallized silicon film is patterned to form an island region 104 used as the active layer of TFTs. Then, a silicon oxide film 105 having a thickness of 200 to 1500 Å, in this embodiment 1000 Å, is formed. This silicon oxide film 105 acts as a gate insulating film (FIG. 5A).

The silicon oxide film 105 must be fabricated under controlled condition. In the present embodiment, the film is deposited by RF plasma CVD while heating the substrate in the temperature range of from 150 to 600° C., preferably in the range of from 300 to 450° C., using tetraethoxysilane (TEOS) as the raw material together with oxygen. The raw material TEOS and oxygen are supplied at a pressure ratio 1:1 to 1:3, at a total pressure of from 0.05 to 0.5 Torr, and at RF power of from 100 to 250 W. Instead of RF plasma CVD, a low pressure CVD or a normal pressure CVD using ozone gas in combination with TEOS can be employed as well. In case a low pressure CVD or a normal pressure CVD is used, the substrate temperature is maintained in the range of from 350 to 600° C., preferably, in the range of from 400 to 550° C. After the film deposition, the resulting film is annealed at 400 to 600° C. in oxygen or ozone ambience for duration of from 30 to 60 minutes.

Under this condition, the laminate is heated within an electric furnace or irradiated with KrF excimer laser light having a wavelength of 248 nm and a pulse width of 20 nsec or other equivalent intense light. In this way, the state of the interface between the silicon active layer region 104 and the silicon oxide film 105 is effectively improved. Especially, RTA (rapid thermal annealing) using infrared light is capable of selectively heating only silicon without heating the glass substrate. Therefore, an anneal can be conducted at a higher temperature while retaining the temperature of the substrate below the softening point of the NO glass. In consequence, the interface levels in the interface between the silicon film and the silicon oxide film could be reduced. This is useful for fabrication of insulated gate field effect semiconductor devices.

Figure 5B:
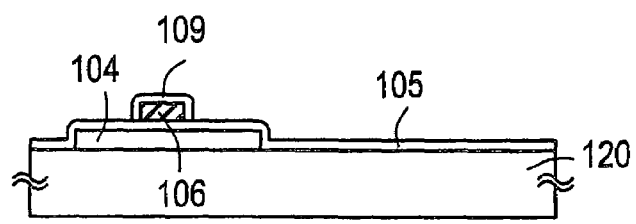

Then, a tantalum film having a thickness of 2000 Å to 1 μm is formed by electron beam evaporation. This film is patterned to form a gate electrode 106. Using platinum and the tantalum electrode as cathode and anode, respectively, an anodization is carried out. In this anodization process, the voltage is increased up to 220 V while maintaining the electric current constant at first. This condition is maintained for 1 hour. Then, the process is ended. In the present embodiment, the appropriate rate at which the voltage is increased is 2 to 5 V/min under the constant current state. In this way, an anodic oxide film 109 having a thickness of 1500 to 3500 Å, e.g., 2000 Å, is formed (FIG. 5B).

Then, using the gate electrode 106 as a mask, impurities, or phosphorus ions, are introduced into the silicon island region 104 of the TFT by self-aligning ion doping, or plasma doping. Phosphine ($PH_3$) is used as a dopant gas. The dose is $1\times10^{15}$ cm$^{-2}$ to $4\times10^{15}$ cm$^{-2}$.

Figure 5C:
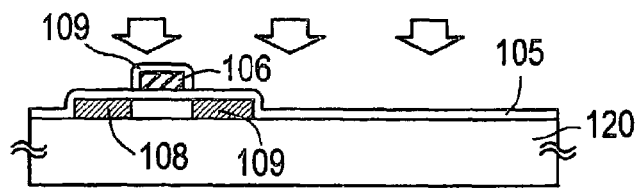

As shown in FIG. 5C, the laminate is irradiated with KrF excimer laser light having a wavelength of 248 nm and a pulse duration of 20 nsec to recover the crystallinity of the portions whose crystallinity is deteriorated by introducing of the impurities. The energy density of the laser light is 150 to 400 mJ/cm$^2$, preferably 200 to 250 mJ/cm$^2$. In this way, N-type doped regions 108 and 109 are formed. The sheet resistance of these regions is 200 to 800 Ω/square.

In this process, heating treatment inside an electric furnace can be used instead of the use of laser light. Also, RTA (rapid thermal annealing, also known as RTP) can be employed. In particular, the temperature of the silicon monitor is elevated to 1000 to 1200° C. in a short time, using a flash lamp, to heat the sample. In this way, intense light equivalent to laser light can be used.

Figure 5D:
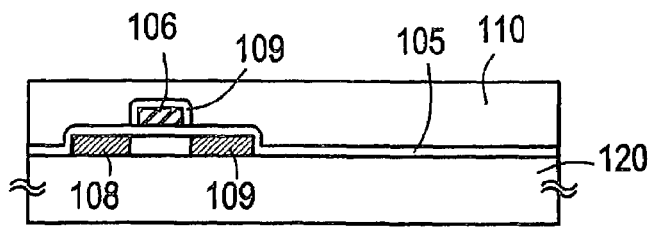

Thereafter, a silicon oxide film having a thickness of 3000 Å is formed as an interlayer insulator 110 over the whole surface of the laminate by plasma CVD using TEOS and oxygen, LPCVD or normal pressure CVD using TEOS and ozone. The substrate temperature is 250 to 450° C., e.g., 350° C. To flatten the surface after the formation of the film, this silicon oxide film is mechanically polished (grinded) (FIG. 5D).

Figure 5E:
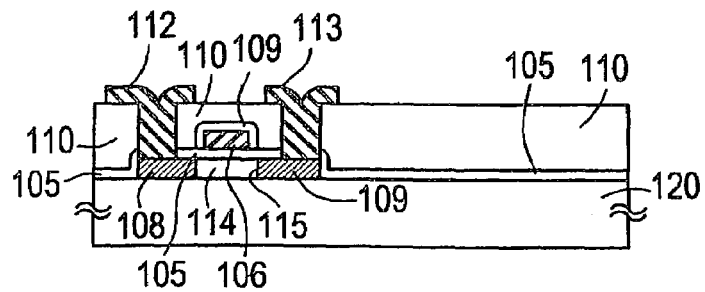

The interlayer insulator 110 is etched to form contact holes in the source/drain regions of the TFT as shown in FIG. 5E. Conductive wirings 112 and 113 are fabricated from chromium or titanium nitride.

In the past, the silicon oxide film introduced with nickel by plasma processing is often etched in the contact hole formation process, because the nickel-doped silicon oxide film has a lower selectivity with respect to buffered hydrofluoric acid than the silicon oxide film.

In the present embodiment, however, if nickel is introduced using aqueous solution of a low concentration of 10 ppm, the contact holes could be stably created with high reproducibility, because the resistance to hydrofluoric acid is high.

Finally, the laminate is annealed for 0.1 to 2 hours at 300 to 400° C. in a hydrogen ambience, thus completing hydrogenation of the silicon. In this way, the TFT is completed. The numerous TFTs manufactured at the same time are arranged in rows and columns, thus completing an active matrix liquid crystal display. The TFT has source/drain regions 108 and 109 and channel forming regions 114. Indicated by 115 is an electrical NI junction.

It is considered that where the structure of the present embodiment is adopted, the concentration of nickel existing in the active layer is approximately $3\times10^{18}$ atoms/cm$^3$ or between $1\times10^{15}$ and $3\times10^{18}$ atoms/cm$^3$.

The mobility of the TFTs manufactured in the present embodiment is in excess of 200 cm$^2$/Vs for N-channel. Also, $V_{th}$ is small. In this way, good characteristics are obtained. We have confirmed that variations in the mobility are ±10%. We consider that the small variations in the mobility are attributed to incomplete crystallization by heating and promotion of crystallization by the subsequent high temperature (in the present embodiment, 800° C.) thermal processing. Further, we consider that the small variations in the mobility are attributed to incomplete crystallization by heating and promotion of crystallization by irradiation of laser light. Where only a crystallization process by thermal processing conducted below 650° C. is utilized, or Where only a crystallization process by irradiation of laser light is utilized, it is easy to obtain N-channel TFTs having mobilities exceeding 150 cm$^2$/Vs. However, variations are large, and uniformity comparable to the uniformity achieved in the present embodiment cannot be obtained.

In the present embodiment, a tantalum gate is used. Obviously, a silicon gate using P- or N-type polysilicon can be used instead. Also, it is possible to perform a high temperature anneal after patterning the laminate into an island. In this case, it is difficult to make a mask alignment because of shrinkage of the substrate. Therefore, it is desired to use a substrate made of quartz.

[Embodiment 6]

In the present embodiment, nickel is introduced selectively in the same way as in Embodiment 4. Using the resulting lateral (i.e., direction parallel to the substrate) crystal growth region, an electronic device is fabricated. In this structure, the concentration of nickel in the active region of the device can be reduced further. This is quite desirable in the electrical stability and reliability of the device.

FIGS. 6A to 6E shows manufacturing processes of the present embodiment. First, a substrate 201 made of quartz is cleaned. A base film 202 of silicon oxide having a thickness of 2000 Å is formed by plasma PCVD, using TEOS and oxygen as raw material gases. In the present embodiment, the base film is formed to fabricate the device with special care. Where contamination and other problems can be neglected, this process can be omitted. Then, an amorphous silicon film 203 of the intrinsic (I type) is formed by plasma CVD. The thickness of this film 203 is 500 to 1500 Å, e.g., 1000 Å. Next, a silicon oxide film 205 having a thickness of 500 to 2000 Å, e.g., 1000 Å, is formed by plasma CVD. The silicon oxide film 205 is selectively etched to form exposed regions 206 of the amorphous silicon.

A solution (in the present embodiment, an acetate solution) 207 containing nickel is applied by the method of Embodiment 4, wherein the nickel is a catalytic element for promoting crystallization. The concentration of the nickel in the acetate solution is 100 ppm. Other manufacturing sequence and conditions are similar to those of Embodiment 4, 5, or 6.

Figure 6A:
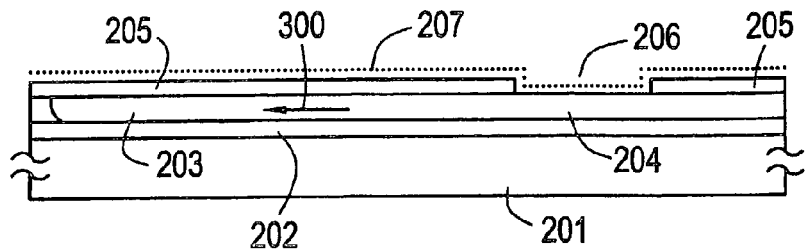
FIGS. 6A to 6E are diagrams explaining forming processes of Embodiment 6 of the invention.

Thereafter, the laminate is annealed at 500 to 620° C., e.g., 550° C., for 4 hours in a nitrogen ambience to crystallize the silicon film 203. Crystals grow from the region 206 in which nickel is in contact with the silicon film along a direction parallel to the substrate as indicated by the arrow 300. Nickel is directly introduced into a region 204, and this region is crystallized. A region 203 indicates a laterally crystallized portion, which is about 25 μm. We confirmed that crystals grow substantially in <111> axial direction (FIG. 6A).

After the crystallization process using the heating processing, the whole surface of the silicon oxide film 205 is etched. Subsequently, the laminate is annealed at a high temperature of 1050° C. for about 60 minutes in an oxygen ambience to improve the crystallinity. At the same time, a thermal oxide film having a thickness of about 1000 Å is formed. If stress presents no problems, this thermal oxide film can be used as a gate insulating film. In the present embodiment, this thermal oxide film is not used, taking account of the stress.

Then, the thermal oxide film is removed. After patterning the silicon film 204, active island region 208 is formed by dry etching. In FIG. 6A, nickel is directly introduced into a region 206. This region 206 is heavily doped with nickel. That is, concentration of nickel contained in the region 206 is high. We have confirmed that the front ends of growing crystals are heavily doped with nickel. These regions are more heavily doped with nickel than in the intermediate regions. Accordingly, in the present embodiment, these heavily doped regions are designed not to overlap the channel forming region within the active layer 208.

Figure 6B:
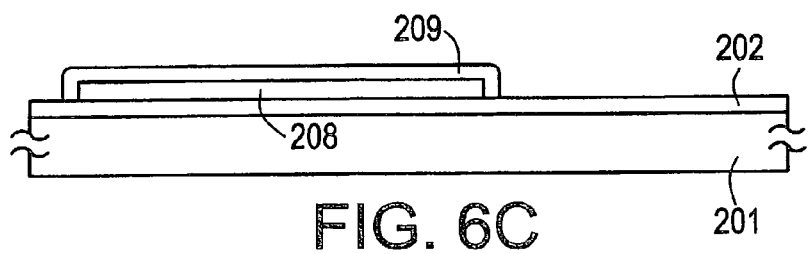

Thereafter, a high temperature CVD oxide film is formed by LPCVD using TEOS while heating the substrate at 800 to 850° C. This is used as a silicon oxide film 209 acting as a gate insulating film. The thickness of the silicon oxide film 209 is 1000 Å (FIG. 6B).

Figure 6C:
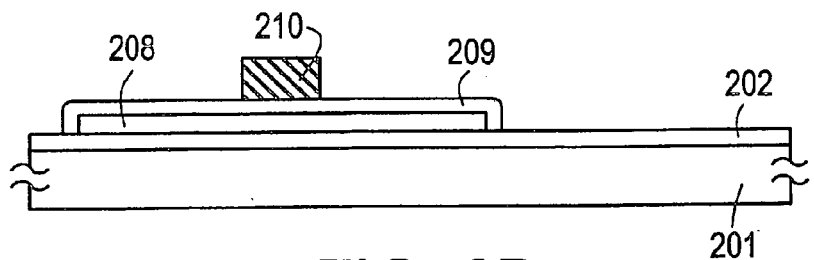

Subsequently, polysilicon film doped with phosphorus or boron is deposited to a thickness of 1000 to 4000 Å by LPCVD. The polysilicon film is used as a gate electrode. The polysilicon film is patterned to form the gate electrode 210 (FIG. 6C).

Figure 6D:
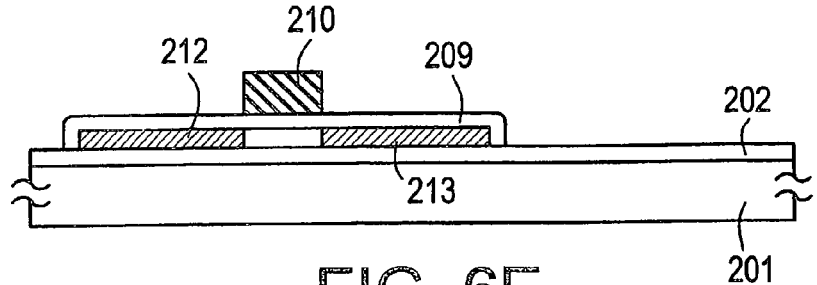

Then, using the gate electrode 210 (or gate electrode 210 and surrounding oxide layer not shown) as a mask, impurities for providing N-conductivity type (in the present embodiment, phosphorus ions) are doped into the active layer regions (forming source/drain regions and channel) by self-aligning ion doping, or plasma doping. Phosphine (PH$_3$) is used as a dopant gas. The accelerating voltage is 60 to 90 kV, e.g., 80 kV. The dose is $1 \times 10^{15}$ cm$^{-2}$ to $8 \times 10^{15}$ cm$^{-2}$, e.g., $4 \times 10^{15}$ cm$^{-2}$. As a result, N-type doped regions 212 and 213 could be formed (FIG. 6D).

Then, the laminate is heated at 600° C. for 12 hours in a nitrogen ambience to activate the impurities. After this activation process, the laminate is heated at 400° C. for 1 hour in a hydrogen ambience, if necessary. This is effective in reducing the defect level density.

Then, a silicon oxide film 214 having a thickness of 6000 Å is formed as an interlayer insulator by plasma CVD. A transparent polyimide film 215 is formed by spin coating. In this way, the film 215 of the surface is flattened.

Figure 6E:
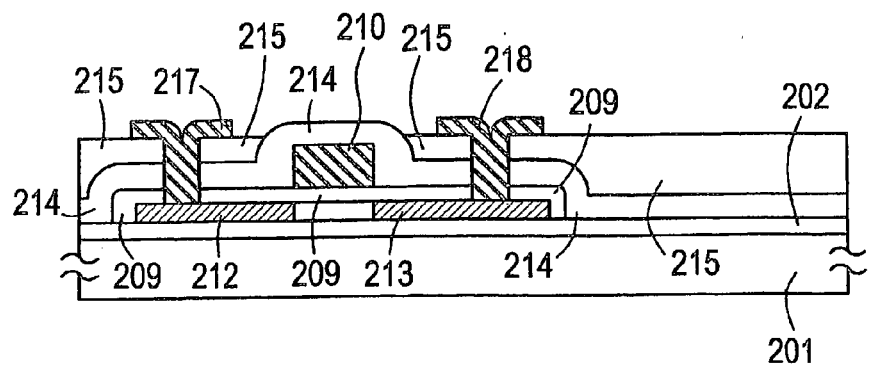

Contact holes are formed in the interlayer insulators 214 and 215. Electrodes/wirings 217 and 218 for the TFTs are fabricated from a multilayer film having metal materials, e.g., titanium nitride and aluminum. Finally, the laminate is annealed at 350° C. for 30 minutes at 1 atmospheric pressure in a hydrogen ambience, thus completing an active matrix circuit having the TFT (FIG. 6E).

Since the TFT fabricated in the present embodiment has high mobility, the TFT can be used in a driver circuit for an active matrix liquid crystal display.

[Embodiment 7]

Figure 7A:
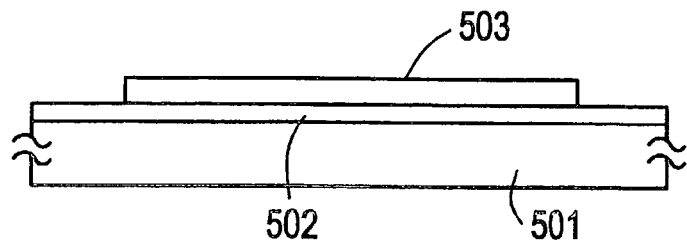
FIGS. 7A to 7D are diagrams explaining forming processes of Embodiment 7 of the invention.

FIGS. 7A to 7D shows cross sectional views, illustrating manufacturing processes of the present invention. First, a base film 502 of silicon oxide having a thickness of 2000 Å is formed on a substrate 501 of quartz by sputtering. Then, an amorphous silicon film of the intrinsic (I type) is formed by plasma CVD or LPCVD. The thickness of this amorphous film is 500 to 1500 Å, e.g., 1000 Å. Nickel acting as a catalytic element for promoting crystallization is introduced into the surface of the amorphous silicon film by the method described in Embodiment 3. The laminate is annealed at 550° C. for 4 hours in a nitrogen ambience at atmospheric pressure to crystallize the amorphous silicon film. The amorphous silicon film is patterned into a silicon island 503 (an active layer of TFT) each of which is 10 to 1000 μm square (FIG. 7A).

Then, the laminate is annealed at 800 to 1100° C., typically 1000° C., for about 2 hours in an oxygen ambience to improve the crystallinity and the interface characteristics. A gate insulating film 504 having a thermal oxide film is formed to a thickness of 500 to 1500 Å, e.g., 1000 Å. It is to be noted that the original silicon film is decreased from its surface by more than 50 Å by the oxidation. As a result, the contamination existing just on the surface of the silicon film is prevented from reaching the interface between the silicon and the silicon oxide. That is, a clean interface is obtained. Since the silicon oxide film is twice as thick as the silicon film, if the silicon oxide film of 1000 Å is formed by oxidizing the silicon film of 1000 Å, then the thickness of the remaining silicon film is 500 Å.

Figure 7B:
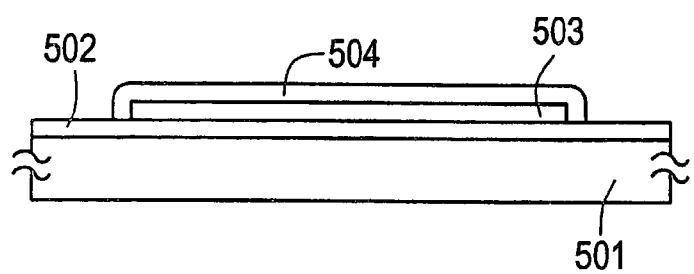

After forming the silicon oxide film 504 by thermal oxidation, the substrate is annealed at 600° C. for 2 hours in a 100% dinitrogen monoxide ambience (1 atmosphere pressure) (FIG. 7B).

Subsequently, a polysilicon film containing 0.01 to 0.2% phosphorus and having a thickness of 3000 to 8000 Å, e.g., 6000 Å, is formed by LPCVD. The silicon film is patterned to form a gate electrode 505. Using the gate electrode of the silicon film as a mask, impurities for providing N-conductivity type (in the present embodiment, phosphorus ions) are introduced into the active layer region (forming source/drain regions and channel) by self-aligning ion doping, or plasma doping. Phosphine (PH$_3$) is used as a dopant gas. The accelerating voltage is 60 to 90 kV, e.g., 80 kV. The dose is $1 \times 10^{15}$ cm$^{-2}$ to $8 \times 10^{15}$ cm$^{-2}$, e.g., $5 \times 10^{15}$ cm$^{-2}$. As a result, N-type doped regions 506 and 507 could be formed.

Figure 7C:
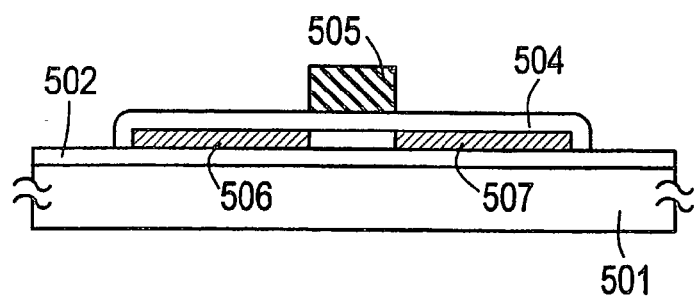

Then, the laminate is heated at 600° C. for 12 hours to activate the impurities. This activation process may also be effected using laser irradiation (FIG. 7C).

This process for activating the impurities may also utilize lamp annealing using near infrared light. Near infrared light is more easily absorbed by crystallized silicon than by amorphous silicon. An effective anneal comparable to thermal annealing conducted above 1000° C. can be carried out. However, near infrared light is not readily absorbed by glass substrate. Far infrared light is absorbed by glass substrate but visible light and near infrared light having wavelengths of 0.5 to 4 μm are not easily absorbed. Therefore, the glass substrate is not heated to a high temperature. Also, the treatment can be made in a short time. Consequently, in the present embodiment, no problems occur because the substrate is made of quartz. The present embodiment is the best method in a process where shrinkage of the glass substrate poses problems.

Figure 7D:
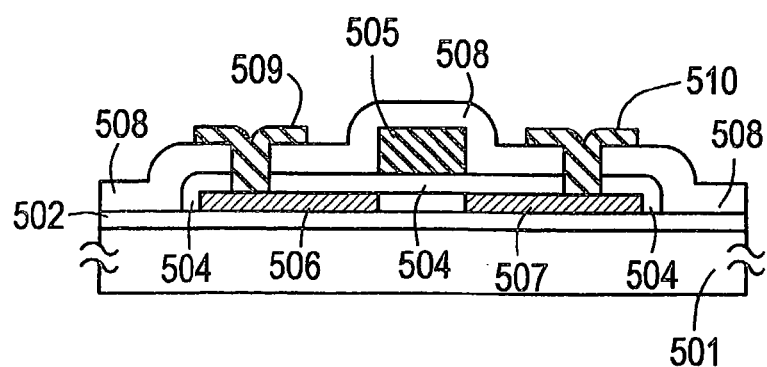

Subsequently, a silicon oxide film 508 having a thickness of 6000 Å is formed as an interlayer insulator by plasma CVD. Polyimide may be used as the interlayer insulator. Then, contact holes are formed. Electrodes/wirings 509 and 510 for the TFT are fabricated from a multilayer film having metal materials, e.g., titanium nitride and aluminum. Finally, the laminate is annealed at 350° C. for 30 minutes at 1 atmosphere pressure in a hydrogen ambience, thus completing the TFT (FIG. 7D).

The mobility of the TFT obtained by the method described above is 110 to 150 cm$^2$/Vs, and the S-value is 0.2 to 0.5 V/line. P-channel TFT having source/drain in which boron is doped by the same method are manufactured. The mobility is 90 to 120 cm$^2$/Vs, and the S-value is 0.4 to 0.6 V/line. Compared with TFT having a gate insulating film formed by a well known PVD or CVD process, the mobility is higher by more than 20%, and the S-value is lower by more than 20%.

[Embodiment 8]

Figure 8:
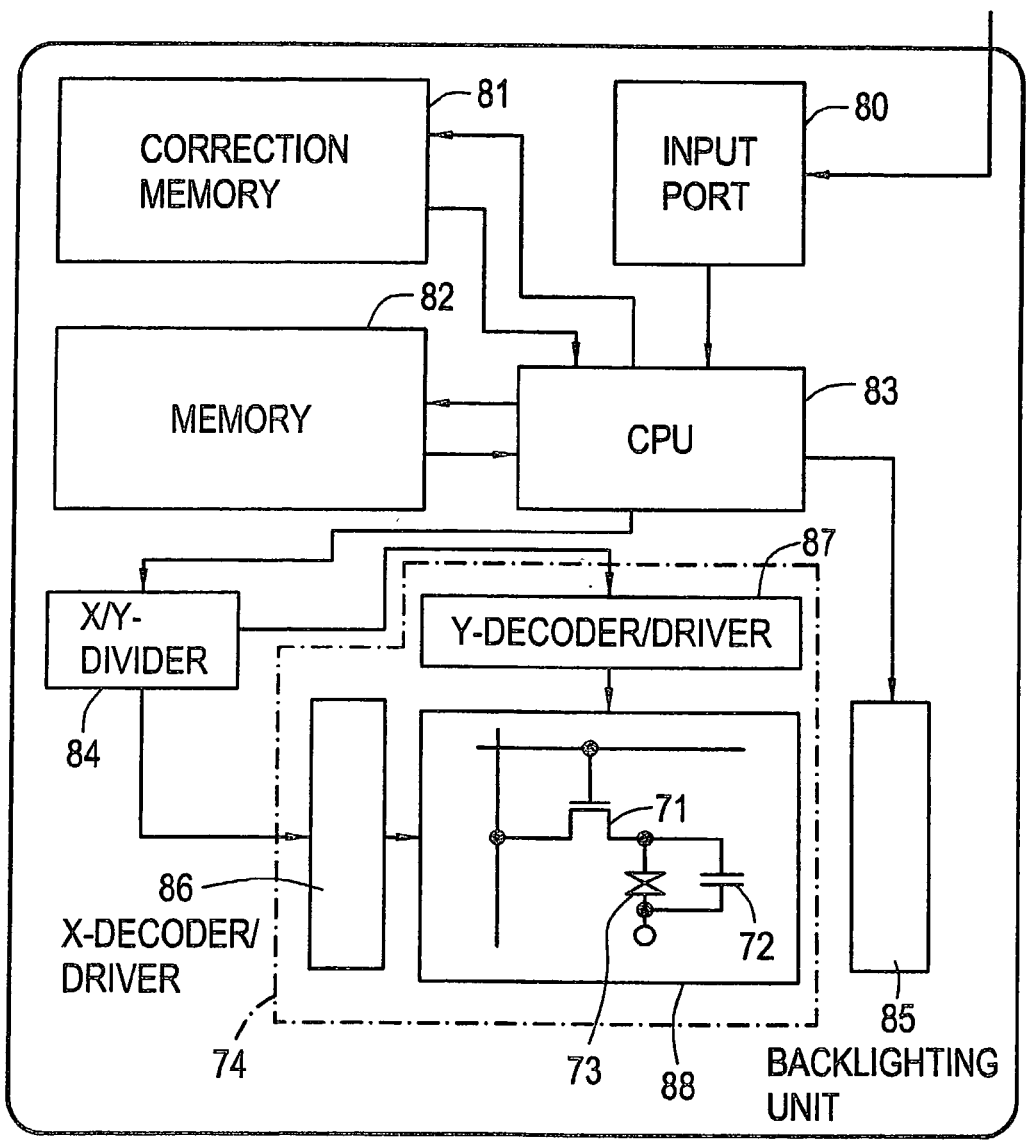
FIG. 8 is a diagram representing a structure of Embodiment 8 of the invention.

The present embodiment is an electro-optical system using an integrated circuit in which a display, a CPU, a memory and the like are arranged as shown in FIG. 8. The system is formed on a sheet of glass substrate. The integrated circuits are fabricated from TFTs using a crystalline silicon film according to the present invention.

In FIG. 8, the electro-optical system comprises display unit 74, input port 80, correction memory 81, memory 82, CPU 83, X/Y-driver 85, backlighting unit 85, and power supply circuit 90. The display unit has X-decoder/driver 86, Y-decoder/driver 87 and active matrix panel 88. The active matrix panel 88 has TFT 71, condenser 72 and liquid crystal 73.

The input port 80 reads an image signal from the outside such as a computer system and converts it into image data. A correction memory 81 is a memory intrinsic to the active matrix panel 88 and corrects the image data according to the characteristics of the panel 88. The correction memory 82 serves as a nonvolatile memory which stores information intrinsic to each pixel and corrects the information. Where point defects exist in some pixels of the electro-optical system, corresponding correcting data is supplied to the surrounding pixels to cover and make less conspicuous the point defects. When a pixel is darker than the surrounding pixels, image data is supplied so as to agree the darker pixel in brightness with the surrounding pixels.

The CPU 83 and memory 82 are the same as those used in ordinary computers. The memory 82 stores image data corresponding to the pixels, as a RAM. The intensity of light emitted from a backlighting unit 85 which illuminates the substrate from the rear side can be varied according to the image information.

In the present embodiment, required ICs are fabricated on the same substrate from TFTs using a crystalline silicon film. In this way, a large integrated liquid crystal display can be obtained.

A crystalline silicon film having large grains is fabricated by introducing a catalytic element at a relatively low temperature. Then, the film is annealed at a high temperature. As a result, a silicon film having high crystallinity can be fabricated. A semiconductor device is manufactured using this crystalline silicon film. In this manner, devices having good characteristics can be fabricated with high productivity.

What is claimed is:

1. A semiconductor device, comprising:
   substrate;
   an active matrix portion formed over the substrate; and
   a CPU formed over the substrate and operationally connected to the active matrix portion, each of the active matrix portion and the CPU comprising at least one thin film transistor comprising a semiconductor island as an active layer,
   wherein said semiconductor island comprises crystalline silicon and contains a metal for promoting crystallization of silicon.

2. The semiconductor device according to claim 1 wherein said metal comprises at least one element selected from the group consisting of nickel, cobalt, iron and platinum.

3. A semiconductor device, comprising:
   a substrate;
   an active matrix portion formed over the substrate; and
   a CPU formed over the substrate and operationally connected to the active matrix portion, each of the active matrix portion and the CPU comprising at least one thin film transistor comprising a semiconductor island as an active layer,
   wherein said semiconductor island comprises crystalline silicon and has a crystal growth direction approximately parallel with a major surface of the substrate.

4. The semiconductor device according to claim 3 wherein said semiconductor island contains a metal for promoting crystallization of silicon.

5. The semiconductor device according to claim 3 wherein said semiconductor island contains a material for promoting crystallization of silicon, said material comprising at least one element selected from the group consisting of nickel, cobalt iron and platinum.

6. A semiconductor device, comprising:
   a substrate;
   an active matrix portion formed over the substrate; and
   a CPU formed over the substrate and operationally connected to the active matrix portion, each of the active matrix portion and the CPU comprising at least one thin film transistor comprising a semiconductor island as an active layer wherein said semiconductor island is formed on and in direct contact with an insulating surface over said substrate,
   wherein said semiconductor island comprises crystalline silicon and contains a metal for promoting crystallization of silicon.

7. The semiconductor device according to claim 6 wherein said metal comprises at least one element selected from the group consisting of nickel, cobalt, iron and platinum.

8. A semiconductor device, comprising:
   a substrate; and
   a CPU formed over the substrate and comprising at least one thin film transistor comprising a semiconductor island as an active layer wherein said semiconductor island is formed on and in direct contact with an insulating surface over said substrate,
   wherein said semiconductor island comprises crystalline silicon and contains a metal for promoting crystallization of silicon.

9. The semiconductor device according to claim 8 wherein said metal comprises at least one element selected from the group consisting of nickel, cobalt, iron and platinum.

* * * * *